(12) United States Patent
Cheng

(10) Patent No.: US 7,767,537 B2
(45) Date of Patent: Aug. 3, 2010

(54) SIMPLIFIED METHOD OF FABRICATING ISOLATED AND MERGED TRENCH CAPACITORS

(75) Inventor: Kangguo Cheng, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 399 days.

(21) Appl. No.: 11/873,735

(22) Filed: Oct. 17, 2007

(65) Prior Publication Data

US 2009/0101957 A1 Apr. 23, 2009

(51) Int. Cl.
*H01L 21/8242* (2006.01)
*H01L 21/20* (2006.01)
(52) U.S. Cl. ........................ 438/386; 438/243
(58) Field of Classification Search ......... 438/243–249, 438/386–392, E29.345, E21.09
See application file for complete search history.

(56) References Cited

U.S. PATENT DOCUMENTS

| 4,849,854 A * | 7/1989 | Eguchi | 438/389 |
| 5,736,753 A * | 4/1998 | Ohno et al. | 257/77 |
| 2009/0108403 A1* | 4/2009 | Gogoi | 438/386 |

\* cited by examiner

*Primary Examiner*—Cuong Q Nguyen
(74) *Attorney, Agent, or Firm*—Joseph Petrokaitis; Daryl K. Neff

(57) ABSTRACT

Trench capacitors having small and large sizes can be formed simultaneously using a combined lithography process in which openings in a photomask have the same dimensions and spacings. Larger capacitors are formed when the openings in the photomask are aligned with one crystal plane of the semiconductor substrate causing the resulting trenches in the semiconductor substrate to merge. Smaller capacitors are formed when the openings in the photomask are aligned with another crystal plane of the semiconductor substrate in which case each trench remains separate from other trenches.

11 Claims, 12 Drawing Sheets

SIMPLIFIED METHOD OF FABRICATING ISOLATED AND MERGED TRENCH CAPACITORS

BACKGROUND OF THE INVENTION

The present invention relates to microelectronic devices and their fabrication.

In system-on-a-chip (SoC) technology, various electronic units are integrated together on a single semiconductor chip. Each semiconductor chip is a microelectronic element obtained by severing a semiconductor wafer into individual chips. Such microelectronic element may have multiple levels of memory caches, where each level of cache has different requirements. For example, a level 2 (L2) cache usually requires high-performance (high speed of access or high data rate); while a level 3 (L3) cache typically requires dense, low-power memory. Capacitors play a significant role in memory performance. For this reason, it is desirable for a semiconductor chip to have different sizes of capacitors to meet different device requirements.

Current methods for fabricating different size capacitors on the same chip can contribute to process complexity and cost of production. It would be desirable to use a combined process to simultaneously fabricate capacitors having differences in size and capacitance values.

SUMMARY OF THE INVENTION

In accordance with one aspect of the invention, capacitors having small and large sizes can be formed simultaneously using a combined lithography process in which openings in a photomask have the same dimensions and spacings. Larger capacitors are formed when the openings in the photomask are aligned with one crystal plane of the semiconductor substrate, which causes individual trenches in the semiconductor substrate to merge. Smaller capacitors are formed when the openings are aligned with another crystal plane of the semiconductor substrate, in which case each trench remains separate from other trenches.

In accordance with an aspect of the invention, a microelectronic element is provided which includes "hybrid orientation" trench arrays. In such microelectronic element, a first array containing individually separated trenches is aligned with one crystal plane of the semiconductor substrate and a second array containing merged trenches is aligned with another crystal plane of the substrate.

In accordance with another aspect of the invention, a method is provided for simultaneously fabricating merged trenches and spaced apart trenches extending downwardly into a single-crystal semiconductor substrate from a major surface of the substrate, where the major surface defines a plane aligned with a given crystal orientation of the semiconductor substrate. A plurality of first spaced apart openings and second spaced apart openings are patterned in a mask layer overlying the substrate, where each of the first and second openings has a given length, given width and a center spaced a distance X from a center of a next adjacent one of the first and second openings. In one example, the centers of the first openings can be aligned with a first crystal orientation of the substrate and the centers of the second openings can be aligned with a second crystal orientation of the substrate that is different from the first crystal orientation. Thereafter, the substrate can then be simultaneously etched in accordance with the first and second openings to define merged first trenches which collectively define a single interior volume and spaced apart second trenches each of which defines a respective separate interior volume.

In accordance with yet another aspect of the invention, a microelectronic element is provided which includes a semiconductor substrate. In such microelectronic element, a plurality of merged first trenches collectively defines a single interior volume. A plurality of spaced apart second trenches each defines a respective separate interior volume. Each of the merged first trenches and spaced apart second trenches extends downwardly from a major surface of the substrate, the major surface defining a plane aligned with a given crystal orientation, each of the merged first trenches and the spaced apart second trenches having a center spaced a distance X from a center of a next adjacent one of the merged first trenches and the second spaced apart trenches, the centers of the merged first trenches being aligned with a first crystal orientation and the centers of the second trenches being aligned with a second crystal orientation different from the first crystal orientation.

In accordance with another embodiment of the invention, a decoupling capacitor is provided which includes an array of merged trenches.

DETAILED DESCRIPTION

The embodiments of the invention herein enable trench capacitors to be fabricated with large differences in size, and thus capacitance. These differences in size and capacitance can be achieved even though patterns of a photomask used to define each trench have the same size. The embodiments of the invention herein utilize properties of the semiconductor crystal in a beneficial way. When trenches occur in a line aligned with a particular plane of the semiconductor crystal, the trenches remain spaced apart from each other. In that case, each trench can be fabricated into an individual trench capacitor isolated from other trenches.

However, when trenches occur in a line aligned with another plane of the semiconductor crystal, the areas of the trenches can become overlapped. In that case, the trenches merge. Wall surfaces of several trenches then may connect together. In such case, a large size capacitor having relatively large capacitance can be fabricated with a capacitor dielectric layer that extends along the connected wall surfaces of the merged trenches. Embodiments of the invention describe various ways of patterning trenches in a single-crystal semiconductor region so as to simultaneously form isolated trenches and merged trenches.

Figure 1A:
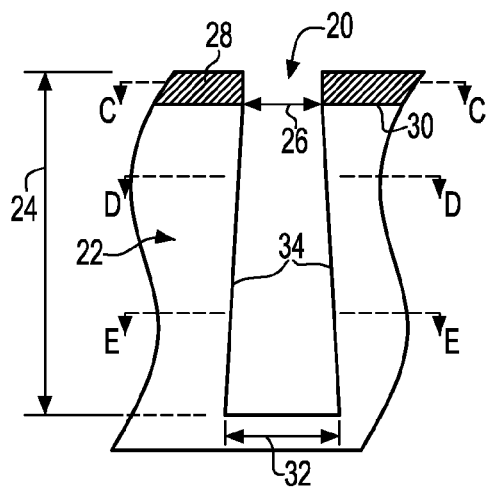
FIGS. 1A through 1E are a sectional view and plan views illustrating a stage in a method of forming trenches in a semiconductor substrate in accordance with an embodiment of the invention, in which a major surface of the semiconductor substrate coincides with a (110) crystal plane of the substrate.

FIG. 1A is a sectional view illustrating a trench 20 that extends downwardly into a single-crystal semiconductor region 22 of a substrate such as a semiconductor wafer or portion of a semiconductor wafer, e.g., a semiconductor chip. The single-crystal semiconductor region can include one or more Group IV elements such as one or more of silicon and germanium, which can be alloyed with carbon. Alternatively, the single-crystal semiconductor region can consist essentially of one or more compounds of Group III elements with one or more Group V elements, among which gallium arsenide and indium phosphide are examples. In another example, the single-crystal semiconductor region can consist essentially of one or more compounds of Group II elements with one or more Group VI elements. The following description of the embodiments of the invention is provided in terms of a semiconductor region consisting essentially of single-crystal silicon or a single-crystal alloy or silicon with another semiconductor material. The principles and application of the embodiments described herein to other types of single-crystal semiconductor materials will be apparent from the following.

The trench typically has a very high aspect ratio, as determined by the ratio of the depth 24 into the substrate divided by the width 26. FIG. 1A depicts the trench following an anisotropic etch process. Anisotropic etch processes such as a reactive ion etch process can be used to form trenches having widths less than 100 nanometers (nm) that reach depths of several microns or more. As further depicted in FIG. 1A, a hard mask 28 such as a pad silicon nitride layer overlies a major surface 30 of the semiconductor region. As further illustrated in FIG. 1A, at this stage of processing, the width 26 of the trench 20 can vary with the depth into the semiconductor region such that the width 26 at the major surface 30 can be either smaller or greater than the width 32 at the bottom of the trench. In the case shown in FIG. 1A, the width 32 at the trench bottom is greater than the width 26 at the major surface. As will become apparent from the following discussion, not only the trench width varies according to the depth of the trench, but also the shape of the trench.

Figure 1C:
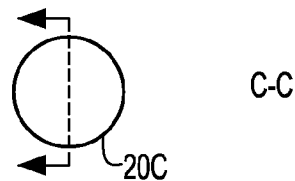
Figure 1D:
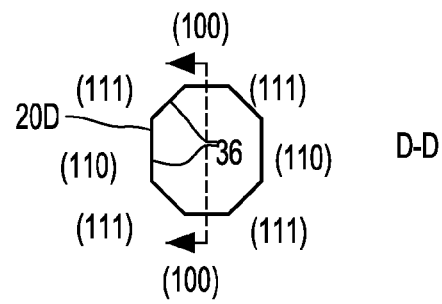
Figure 1B:
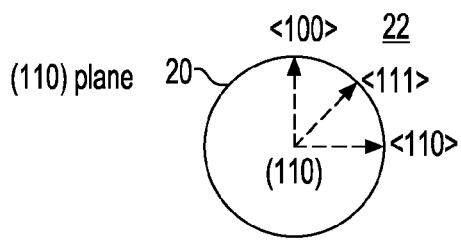

FIG. 1B is a plan view illustrating the shape of the trench 20 at the major surface 30 of the semiconductor region 22. FIG. 1B also shows an orientation of the trench 20 in relation of crystal orientations [planes] of the semiconductor region. The semiconductor region 22 is made of a single silicon crystal. Any material in crystal form is arranged in a regular geometric pattern. For example, when salt is viewed under a microscope, its cube-shaped crystals appear. Not all crystals have cube shape. Diamond crystals are in the shape of tetrahedrons, which are similar to pyramids. When cut, a crystal forms facets which coincide with the crystal planes of the material. Thus, cut diamonds have facets which coincide with the crystal planes of the diamond crystal.

FIG. 1B illustrates the crystal planes of a silicon crystal contained in semiconductor region 22. Crystal planes are described using numbers such as <100>, <110> and <111>. The numbers indicate similarities and differences between the crystal planes. For the present purposes it is sufficient to know each of these unique crystal planes is not parallel to any other crystal plane and that the crystal tends to form facets along these crystal planes. In FIG. 1A, the major surface 30 of the semiconductor region 22 coincides with a (110) plane of the silicon crystal. As also shown in FIG. 1B, the silicon crystal has a crystal plane known as the <100> plane which extends in the up-down direction of FIG. 1B. The up-down direction of the <100> plane is a vertical layout direction; that is, a direction that appears to be up and down the sheet within the plane of the major surface 30 (FIG. 1A). Another crystal plane known as the <110> plane extends in a horizontal layout direction at a 90 angle from the <100> (vertical) crystal plane. A third crystal plane known as the <111> crystal plane is aligned at a 45 degree angle away from each of the <100> and <110> crystal planes.

FIG. 1C is a plan view illustrating a shape of the trench opening 20C in the hard mask layer 28 (FIG. 1A). As apparent from FIG. 1C, the trench opening 20C has a circular shape. The trench opening 20C in the semiconductor region typically remains circular in shape at the major surface 30 (FIG. 1A). The circular shape is a product of the photolithography process which tends to produce a circular opening in the hard mask layer 28. The circular opening in the mask is transferred to the trench opening 20C (FIG. 1C) in the upper part of the trench that is immediately adjacent to the hard mask layer.

On the other hand, deeper down from the major surface, for example, at a depth that is greater than about 0.25 microns, the trench opening 20D (FIG. 1D) begins to take on a faceted shape. At greater and greater depth from the major surface 30 (FIG. 1A), walls of the trench become aligned with the different crystal planes of the silicon crystal. The trench opening 20D exhibits eight walls 36, each wall being aligned with one of the crystal planes. At the top and bottom edges of the trench opening 20D (FIG. 1D), walls are aligned with the <100> crystal plane. At the left and right edges of the trench opening 20D, walls are aligned with the <110> crystal plane. Walls aligned with the <111> crystal plane connect the walls at the left and right edges with the wall at the top edge. Similarly, walls aligned with the <111> crystal plane connect the walls at the left and right edges with the wall at the bottom edge.

Figure 1E:
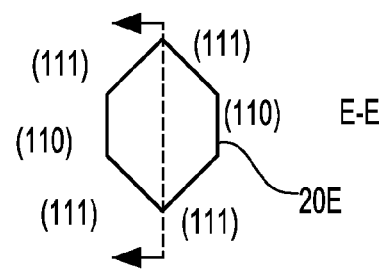

FIG. 1E illustrates the trench opening 20E at even greater depth from the major surface 30 (FIG. 1A). The trench opening 20E typically can take on the appearance seen in FIG. 1E at a depth of about 1 micron or greater. As seen in FIG. 1E, only the walls aligned with the <110> and <111> crystal planes appear in the trench opening 20E at the greater depth. Any material that is not aligned with those crystal planes tends to be removed more readily by the etch process. In this way, only six facets (walls) of the trench opening 20E remain at the greater depth.

The trench 20 seen in FIGS. 1A-1E is illustrated for a case in which the trench has been defined using a reactive ion etch process ("RIE"). FIGS. 2A-2E illustrate the trench after a shaping process is performed subsequently to the RIE process. Shaping can be done using an anisotropic wet etch process which etches semiconductor material from within the trench 20'. In a particular embodiment, an etch solution containing ammonium hydroxide is used as an etchant to shape the trench 20' by taking advantage of the etch rate difference among various crystal planes. For example, the <100> crystal plane is etched at a much greater rate than the <110> and <111> crystal planes. Alternatively, the etchant can include potassium hydroxide (KOH), tetramethylammonium hydroxide (TMAH), hydrazine, or ethylene diamine pyrocatechol (EDP).

Figure 2A:
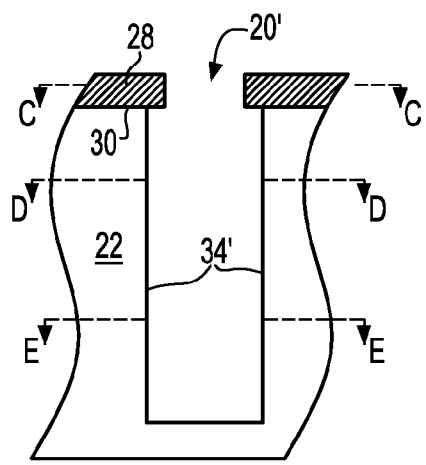
FIGS. 2A through 2E are a sectional view and plan views illustrating a stage subsequent to the stage shown in FIGS. 1A through 1E in a method of forming trenches in a semiconductor substrate in accordance with an embodiment of the invention.
Figure 2B:
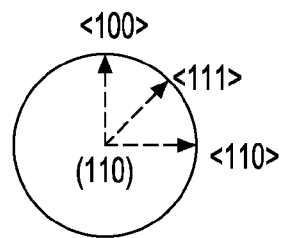
Figure 2C:
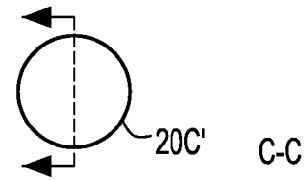
Figure 2D:
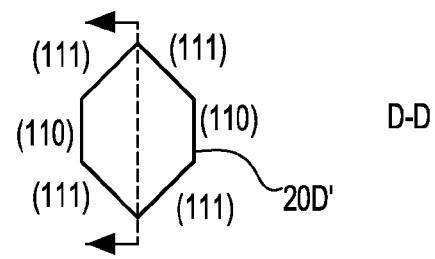
Figure 2E:
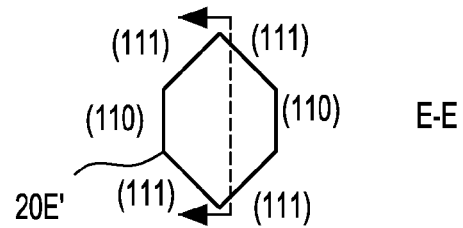

FIG. 2B illustrates the orientations of the <100>, <110> and <111> crystal planes relative to each other, as in FIG. 1B. As seen in FIG. 2A, the orientation of walls 34' of the trench 20' become more vertical than they were in the trench 20 before, as shown in FIG. 1A. FIG. 2C illustrates the trench opening 20C' in the hard mask layer 28 (FIG. 2A), which is seen to be unchanged from that shown in FIG. 1C. However, as further shown in FIG. 2D, the shape of the trench opening 20D' through the section line D-D in FIG. 2A appears like the shape of the trench opening 20E' near the bottom of the trench 20'.

Figure 3A:
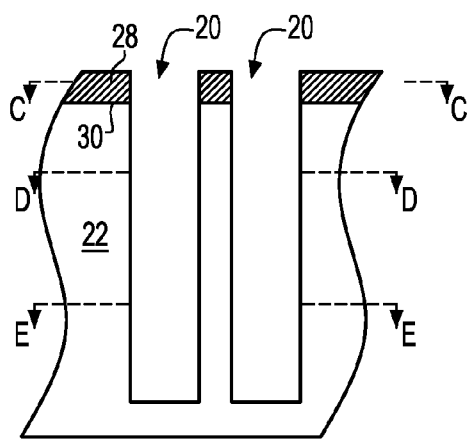
FIGS. 3A through 3E are a sectional view and plan views illustrating formation of trenches aligned with a <110> crystal plane of a semiconductor substrate in accordance with one embodiment of the invention.
Figure 3B:
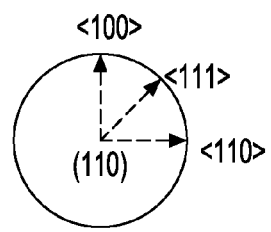
Figure 3C:
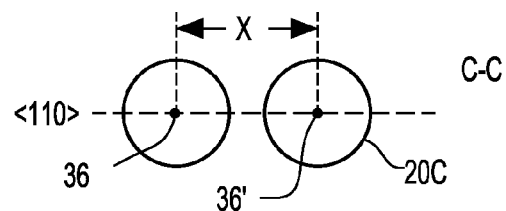

FIGS. 3A-3E illustrate closely-spaced trenches in a semiconductor substrate prior to performing post-RIE shaping as shown and described above with reference to FIGS. 2A-2E. FIG. 3B illustrates the orientations of the <100>, <110> and <111> crystal planes relative to each other, as in FIG. 1B. FIG. 3A shows trenches 20 in close proximity to each other, aligned with the <110> crystal plane of the substrate 22. As shown in FIG. 3C, at the section line C-C, the trenches have circular shape, such that each trench has equal length and width. Each trench opening 20C further has a center 36 which is spaced a distance X from a center of a nearest adjacent trench opening. In geometry, circles have centers; other shapes have centers of mass. The "center of mass" is the geometrical center of a shape, whether the shape is a regular or irregular shape. For any two-dimensional shape, a line through the center of mass divides the shape into halves each having an equal amount of area. As used herein, the term "center" of a polygonal shape means at least approximately its center of mass, recognizing that variations in the lithography process can cause the shapes that result from lithographic processing to vary in extent.

Figure 3D:
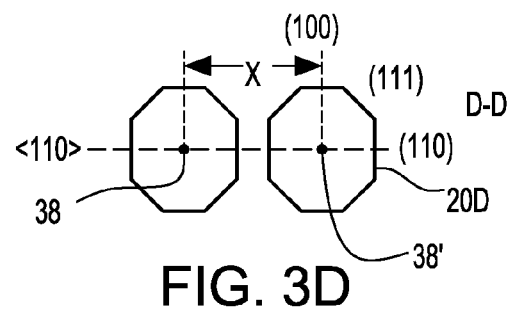
Figure 3E:
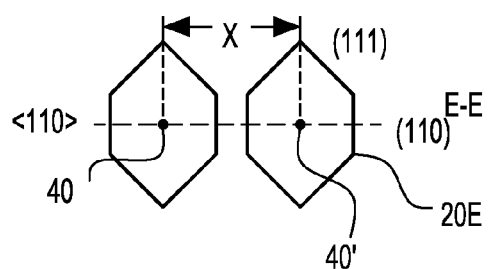

FIG. 3D illustrates the shape of the trench openings 20D through the section line D-D. Here, the trench openings 20D have octagonal shape. Here, the center 38 of a first trench opening 20D is again spaced a distance X from the center 38' of a nearest adjacent one of the trench openings 20D. FIG. 3E illustrates the shape of trench openings 20E near the bottoms of the trenches 20. Again, the center 40 of a first trench opening 20E is spaced a distance X from the center 40' of a nearest adjacent one of the trench openings 20E. Despite the close proximity of the trenches 20 to each other, when the trenches are aligned with the <110> crystal plane, there is no merging of the trenches at any depth within the substrate 22.

Figure 4A:
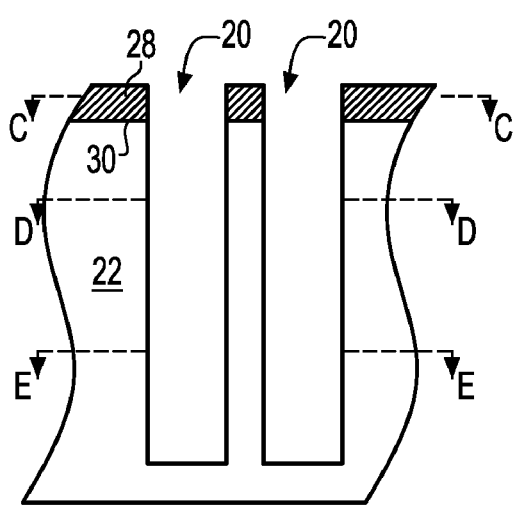
FIGS. 4A through 4E are a sectional view and plan views illustrating formation of trenches aligned with a <111> crystal plane of a semiconductor substrate in accordance with one embodiment of the invention.
Figure 4C:
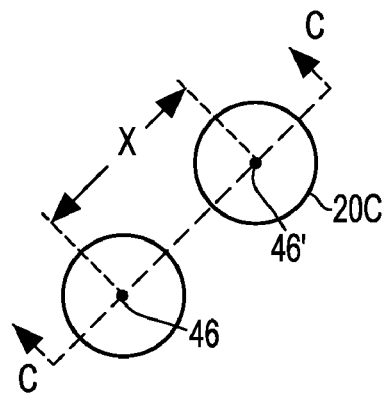
Figure 4B:
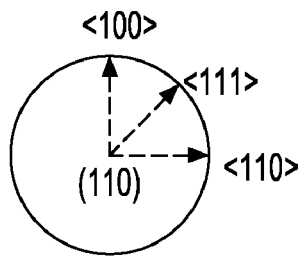
Figure 4D:
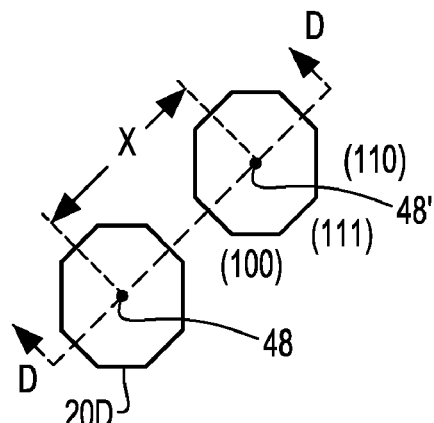
Figure 4E:
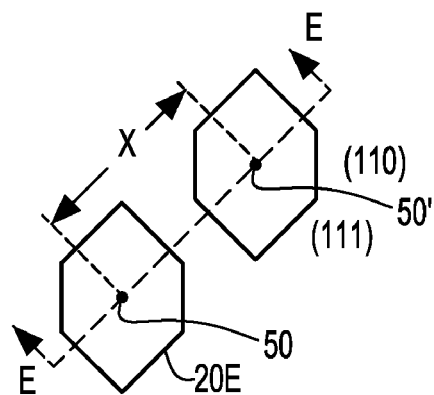

FIGS. 4A-4E also illustrate closely-spaced trenches in a semiconductor substrate prior to performing post-RIE shaping as shown and described above with reference to FIGS. 2A-2E. FIG. 4B illustrates the orientations of the <100>, <110> and <111> crystal planes relative to each other, as in FIG. 1B. FIG. 4A shows trenches 20 in close proximity to each other, aligned with the <111> crystal plane of the substrate 22. FIG. 4C illustrates the trench openings 20C in the hard mask layer 28. Again, the centers 46, 46' of the nearest adjacent circular trench openings 20C are spaced a distance X from each other. As illustrated in FIG. 4D, the center 48 of a first trench opening 20D is again spaced a distance X from the center 48' of a nearest adjacent one of the trench openings 20D. FIG. 4E illustrates the shape of the trench openings 20E near the bottoms of the trenches 20. As shown in FIG. 4E, the center 50 of a first trench opening 20E is spaced a distance X from the center 50' of a nearest adjacent one of the trench openings 20E.

Figure 5A:
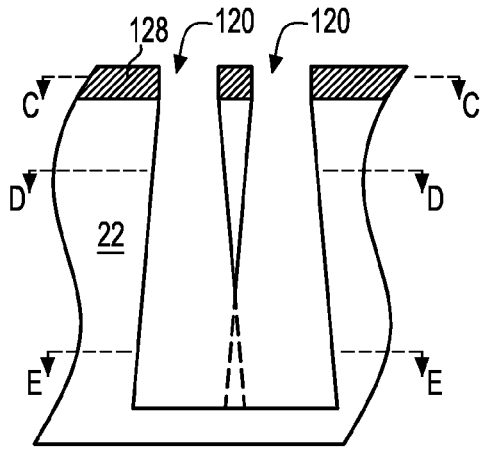
FIGS. 5A through 5E are a sectional view and plan views illustrating formation of merged trenches aligned with a <100> crystal plane of a semiconductor substrate in accordance with one embodiment of the invention.
Figure 5B:
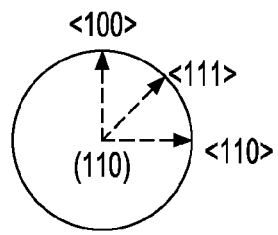
Figure 5C:
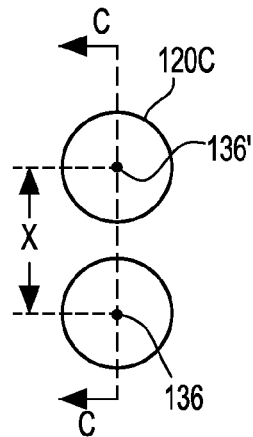
Figure 5D:
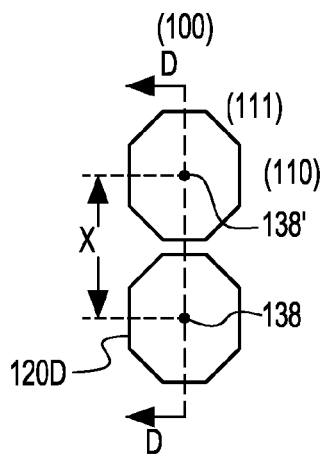

FIGS. 5A-5E illustrates another case in which closely-spaced trenches 120 in a semiconductor substrate are aligned with the <100> crystal plane. FIGS. 5A-5E illustrate the shapes of trenches 120 prior to performing post-RIE shaping as shown and described above with reference to FIGS. 2A-2E. FIG. 5B illustrates the orientations of the <100>, <110> and <111> crystal planes relative to each other, as in FIG. 1B. FIG. 5A shows trenches 120 in close proximity to each other, aligned with the <100> crystal plane of the substrate 122. FIG. 5C illustrates the trench openings 120C in the hard mask layer 128 (FIG. 5A). At the hard mask layer 128, the centers 136, 136' of the nearest adjacent trenches are spaced a distance X from each other, X being the same distance at which the centers of trenches 20 shown in FIGS. 3C and 4C are spaced. FIG. 5D illustrates the octagonal shapes of the trenches 120D through the section line D-D. Again, the centers 138, 138' of the trench openings 120D are spaced the same distance X from each other.

Figure 5E:
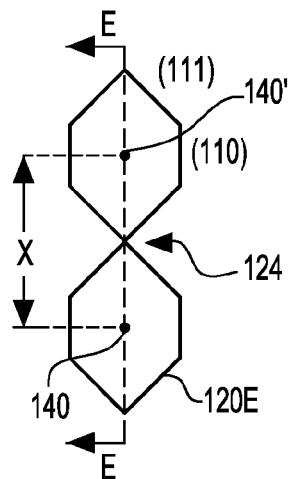
Figure 6A:
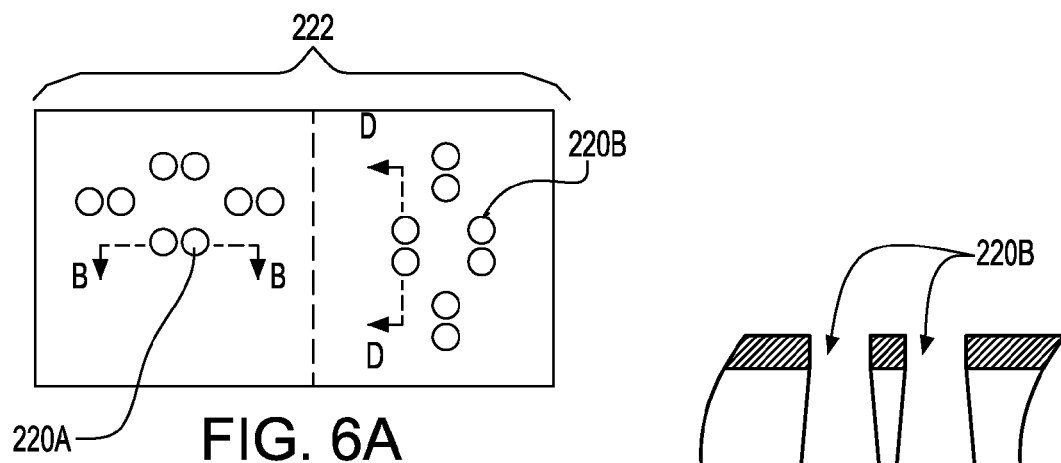
FIGS. 6A through 6E illustrate a method of simultaneously forming merged and separate trenches aligned with <100> and <110> crystal planes of a semiconductor substrate in accordance with one embodiment of the invention.
Figure 6D:
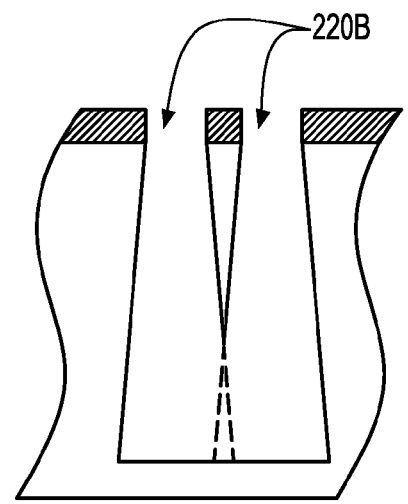
Figure 6B:
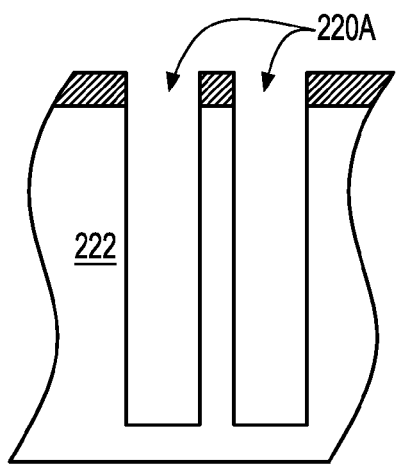
Figure 6C:
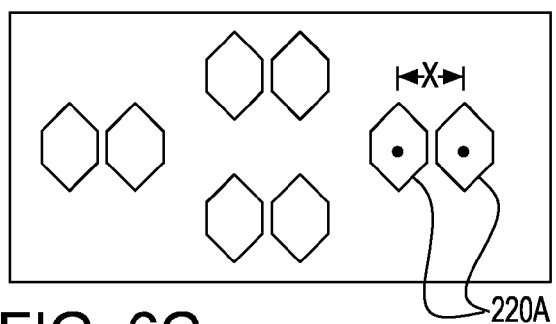
Figure 6E:
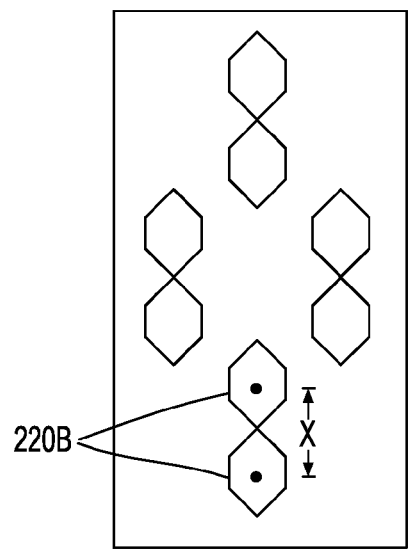

FIG. 5E illustrates the hexagonal shape of the trench openings 120E near the bottoms of the trenches 120. Again, the centers 140, 140' of the trench openings 120E are spaced the same distance X from each other. In this case, when the trenches 120 are aligned with the <100> crystal plane, the trenches merge at least at greater depths of the substrate 22. Merging occurs at corners 124 where the walls of the trenches aligned with the <111> crystal plane extend outward to cause acute-angled corners of the hexagonal trenches to overlap, as shown at section line E-E in FIG. 5A and in the plan view of FIG. 5E.

FIGS. 6A through 6E illustrate results of simultaneous patterning of trenches with different alignments in a single-crystal semiconductor substrate 222 having a major surface which coincides with the (110) crystal plane. Here, the centers of trenches 220A are aligned with the <110> crystal plane and the centers of trenches 220B are aligned with the <100> crystal plane. As shown and previously discussed in FIGS. 3A-3E and 5A-5E, the size and shape of openings in a hard mask layer which define the trenches are the same. When the centers of the trenches are at a close spacing X, the trenches 220A (FIGS. 6B-C) aligned with the <110> crystal plane remain separated. However, the trenches 220B (FIGS. 6D-E) having the same close spacing X and aligned with the <100> crystal plane have bottoms which are merged together at acute-angled corners of the hexagonal trenches. Thus, as seen in FIGS. 6A-E, using photomask patterns having the same size and the same center-to-center spacing, both individually separated trenches 220A and merged trenches 220B can be formed simultaneously in one single-crystal (110) semiconductor substrate using the same etch process, by aligning the separated trenches 220A with the <110> crystal plane and aligning the merged trenches with the <100> crystal plane. Optionally, the shaping process as described above (FIGS. 2A-E) can be performed after forming trenches 220A and 220B.

As shown in FIGS. 1C, 2C, 3C, 4C, 5C and 6A, the trench openings have circular shape in the hard mask layer. Lower down, the shape of the trench openings is similar to a regular (even-sided) polygon such as an octagon shape opening 20D (FIG. 1D) or hexagon shape opening (FIG. 1E). In a variation of the above-described embodiment, trenches shown in FIGS. 1C, 2C, 3C, 4C, 5C and 6A can instead have oval shape, in which the trench is longer in one direction than in another direction. In such case, the octagonal and hexagonal shaped trenches illustrated in other figures (e.g., as in FIG. 1D, 1E) will also be longer in the one direction than in another direction.

Figures 7A, 7B:
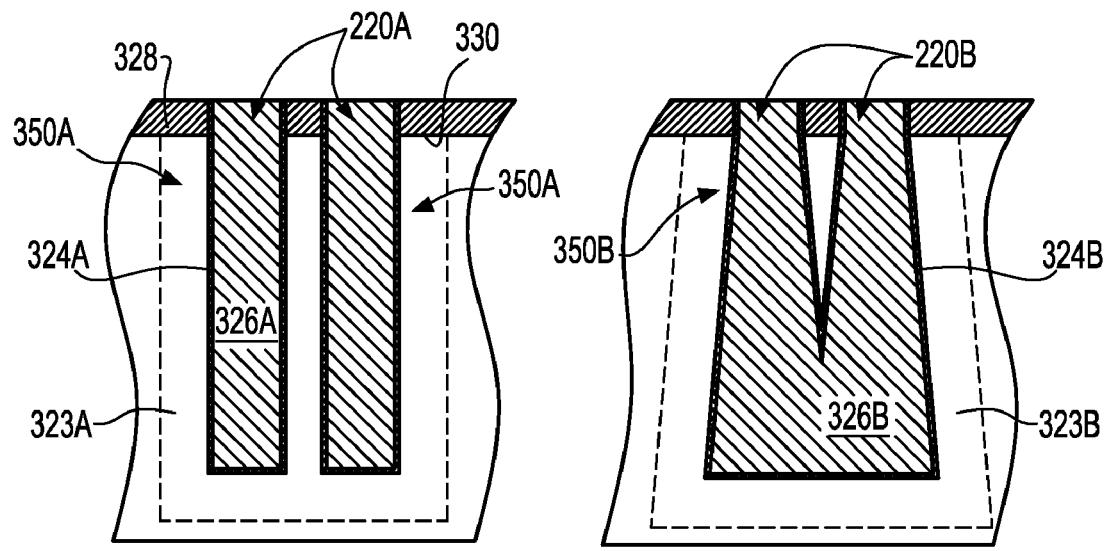
FIG. 7A is a sectional view illustrating capacitors formed in separate or isolated trenches in accordance with one embodiment of the invention.
FIG. 7B is a sectional view illustrating capacitors formed in merged trenches in accordance with one embodiment of the invention.

FIGS. 7A-7B illustrate corresponding trench capacitors 350A and 350B formed in trenches 220A and in trenches 220B, respectively. As seen in FIG. 7A, trench capacitors 350A include a plate electrode 323A, illustratively shown as a doped semiconductor region surrounding the trenches 220A as one plate electrode common to both trench capacitors 350A. Alternatively, the electrode 323A may comprise a conductive layer such as a metal or metallic compound material deposited on the sidewall of the trench 220A. Each of the trench capacitors 350A further includes a node dielectric 324A disposed along inner surfaces of the trenches 220A and a node electrode 326A extending along the node dielectric within each trench 220A. An insulator 328 may overlie the major surface 330 of the single-crystal semiconductor region. The node dielectric 324A can be any dielectric, including but not limited to, silicon oxide, silicon nitride, silicon oxynitride, high-k material, and any combination of these materials. The node electrode 326A may comprise any conductive material, including but not limited to, polycrystalline or amorphous silicon, germanium, silicon germanium, a metal (e.g., tungsten, titanium, tantalum, ruthenium, cobalt, copper, aluminum, lead, platinum, tin, silver, gold), a conducting metallic compound material (e.g., tantalum nitride, titanium nitride, tungsten silicide, tungsten nitride, titanium nitride, tantalum nitride, ruthenium oxide, cobalt silicide, nickel silicide), carbon nanotube, conductive carbon, or any suitable combination of these materials.

A merged trench capacitor 350B (FIG. 7B) also includes a common plate electrode 323B surrounding the trenches 220B, a capacitor dielectric layer 324B and a node electrode 326B. The capacitor dielectric 324B is one continuous merged layer overlying the inner surfaces of the merged trenches 220B. The node electrode 326B also extends continuously to cover the capacitor dielectric layer 324B within both of the merged trenches 220B. In this way, one continuous capacitor 350B is formed which spans both trenches 220B, the trench capacitor 350B having one continuous node electrode 326B and one continuous capacitor dielectric layer 324B.

Figures 8A, 8B:
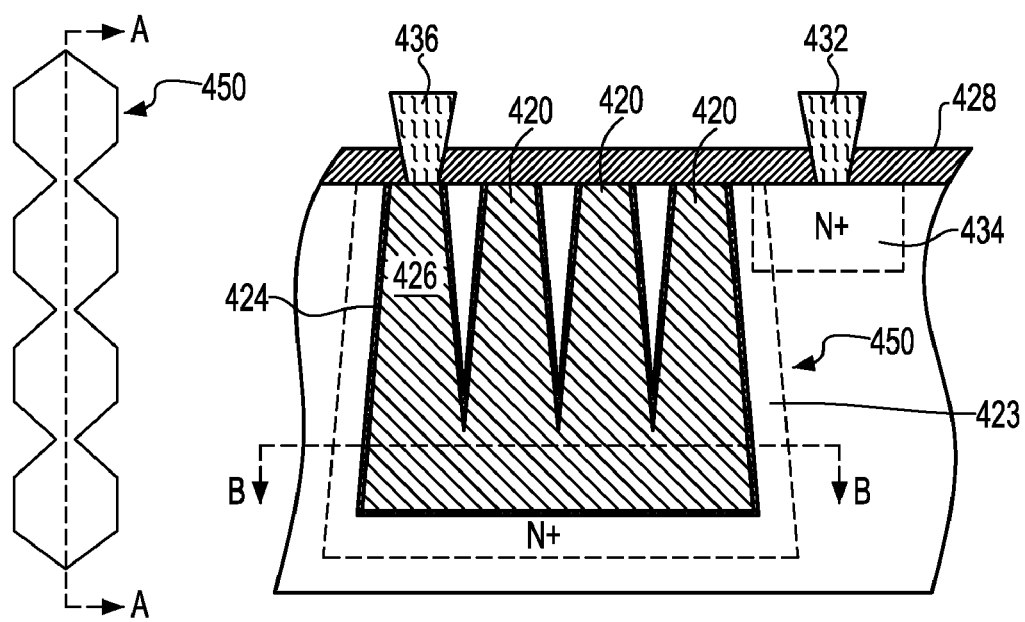
FIG. 8A is a sectional view and FIG. 8B is a corresponding plan view further illustrating a method of forming capacitors in merged trenches in accordance with one embodiment of the invention.

FIG. 8A is a sectional view and FIG. 8B is a corresponding plan view which illustrate a merged trench capacitor 450 formed by the above-described process (FIG. 5A) in which trenches 420 are aligned with the <100> crystal plane of the semiconductor substrate. In this case, all four trenches share one common plate electrode 423 and one merged capacitor dielectric layer 424 which extends continuously along inner surfaces of the merged trenches. A merged node electrode 426 is also common to all four trenches, which extends continuously along inner surfaces of the merged trenches 420. As further shown in FIG. 8A, a plate contact via 432 extends through the insulating layer 428 to provide conductive interconnection with the plate electrode 423, for example, through a well 434 in the semiconductor substrate that overlaps the plate electrode 423. Through the plate contact via 432, the plate electrode 423 can be maintained at one voltage, such as ground. A node contact via 436 extends through the insulating layer 428 to contact the node electrode 426. With the flow of current through the node contact via 436 to and from the node electrode 426 of the capacitor 450, the voltage on the node electrode 426 can reach a different value from the voltage on the plate electrode 423. In a particular embodiment, the merged trench capacitor 450, having larger capacitance value than each of the individual separated trench capacitors 350A (FIG. 7A), is interconnected with other circuitry and used as a decoupling capacitor. In another embodiment, the merged trench capacitor 450 can be used in a charge pump circuit for generating a voltage on the chip. There are many other applications and uses for the merged trench capacitor 450 which are too numerous and varied to enumerate.

Figure 9A:
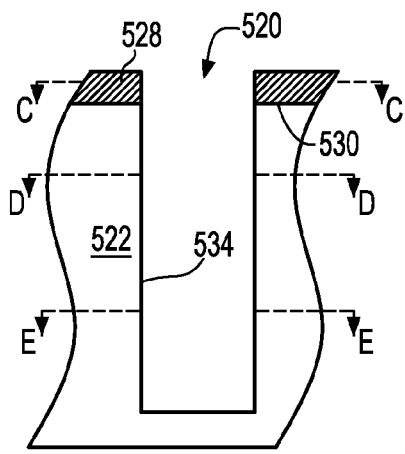
FIGS. 9A through 9E are a sectional view and plan views illustrating a stage in a method of forming trenches in a semiconductor substrate in accordance with an embodiment of the invention, in which a major surface of the semiconductor substrate coincides with a (100) crystal plane of the substrate.

Referring to FIG. 9A, in a variation of the above-described embodiment, the single-crystal semiconductor substrate has a different crystal orientation, such that the major surface 530 is aligned with the (100) crystal plane, instead of the (110) crystal plane. FIG. 9B illustrates the crystal planes of a silicon crystal contained in semiconductor region 522. As also shown in FIG. 9B, the silicon crystal has a crystal plane known as the <110> plane which extends in the up-down direction of FIG. 1B. The up-down direction of the <110> plane is a vertical layout direction; that is, a direction that appears to be up and down the sheet within the plane of the major surface 530 (FIG. 9A). A <110> horizontal crystal plane extends in a horizontal layout direction at a 90 degree angle from the <110> (vertical) crystal plane. A third crystal plane known as the <100> crystal plane is aligned with a line at a 45 degree angle away from each of the vertical and horizontal <110> crystal planes.

Figure 9C:
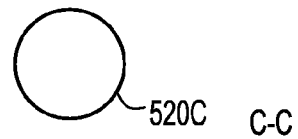

FIG. 9C is a plan view illustrating the circular shape of the trench opening 520C in the hard mask layer 528 (FIG. 9A). The trench opening 520C in the semiconductor region typically remains circular in shape at the major surface 530 (FIG. 9A). The circular opening in the mask is transferred to the trench opening 520C (FIG. 9C) in the upper part of the trench that is immediately adjacent to the hard mask layer.

Figure 9D:
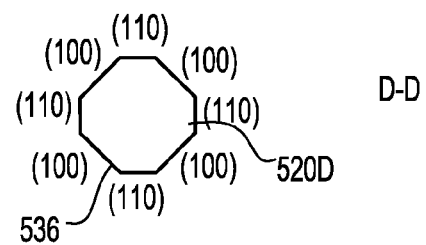
Figure 9B:
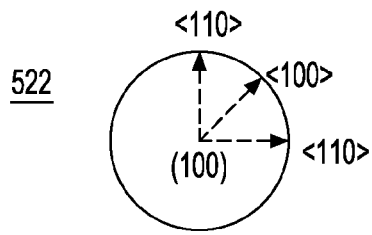

Deeper down from the major surface, for example, at a depth that is greater than about 0.25 microns, the trench opening 520D (FIG. 9D) begins to take on a faceted shape. At greater and greater depth from the major surface 530 (FIG. 9A), walls of the trench become aligned with the different crystal planes of the silicon crystal. The trench opening 520D has eight walls 536, each wall being aligned with one of the crystal planes. At the top and bottom, and left and right edges of the trench opening 520D (FIG. 9D), walls are aligned with the <110> crystal plane. Walls aligned with the <100> crystal plane connect the walls at the left and right edges with the wall at the top edge. Similarly, walls aligned with the <100> crystal plane connect the walls at the left and right edges with the wall at the bottom edge.

Figure 9E:
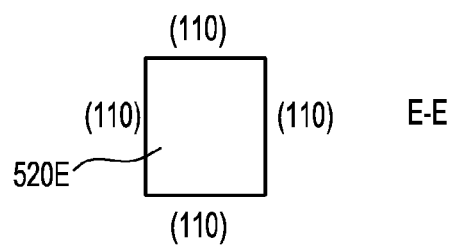

FIG. 9E illustrates the trench opening 520E at even greater depth from the major surface 530 (FIG. 9A). The trench opening 520E typically can take on the appearance seen in FIG. 9E at a depth of about 1 micron or greater. As seen in FIG. 9E, only the walls aligned with the <110> crystal plane appear in the trench opening 520E at the greater depth. Any material that is not aligned with those crystal planes tends to be removed more readily by the etch process. In this way, only four facets (walls) of the trench opening 520E remain at the greater depth and the trench opening has a square or rectangular shape.

The trench 520 seen in FIGS. 9A-9E is illustrated for a case in which the trench has been defined using a reactive ion etch process ("RIE"). FIGS. 10A-10E illustrate the trench after a shaping process is performed subsequently to the RIE process. Shaping can be done using an anisotropic wet etch process which etches semiconductor material from within the trench 520. In a particular embodiment, an etch solution containing ammonium hydroxide is used as an etchant to shape the trench 520 by taking advantage of the etch rate difference among various crystal planes. For example, <100> crystal plane has a much greater etch rate than <110> and <111> crystal planes. Alternatively, the etchant can include potassium hydroxide (KOH), tetramethylammonium hydroxide (TMAH), hydrazine, or ethylene diamine pyrocatechol (EDP).

Figure 10A:
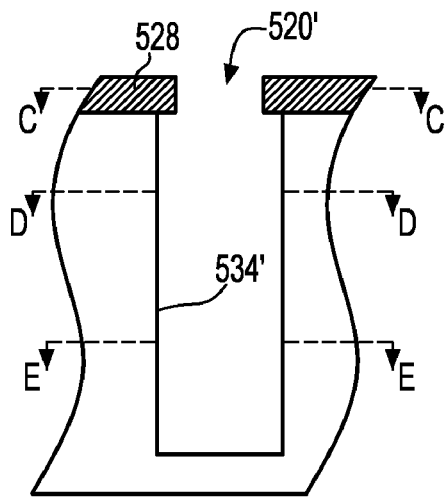
FIGS. 10A through 10E are a sectional view and plan views illustrating a stage subsequent to the stage shown in FIGS. 9A through 9E in a method of forming trenches in a semiconductor substrate in accordance with an embodiment of the invention.
Figure 10B:
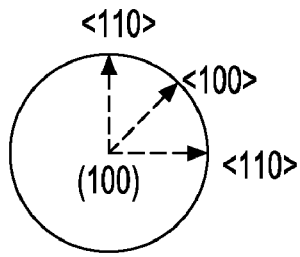
Figure 10C:
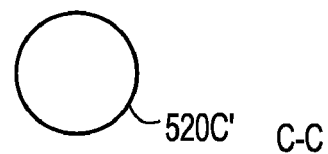
Figure 10D:
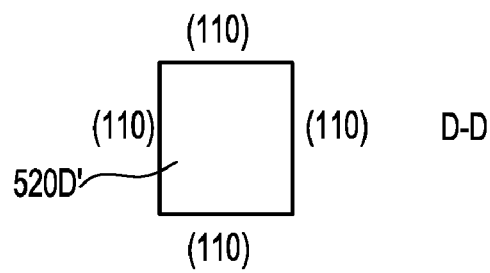
Figure 10E:
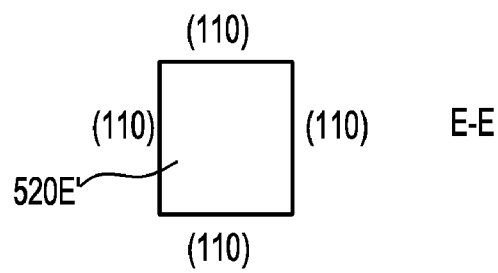

FIG. 10B illustrates the orientations of the <100> and <110> crystal planes relative to each other, as in FIG. 9B. As seen in FIG. 10A, walls 534' of the trench 520' become widened in relation to the walls 534 of trench 520 (FIG. 9A). FIG. 10C illustrates the trench opening 20C' in the hard mask layer 528 (FIG. 10A), which remains circular. However, as further shown in FIG. 10D, the shape of the trench opening 520D' through the section line D-D in FIG. 10A is square or rectangular, like the shape of the trench opening 520E' (FIG. 10E) near the bottom of the trench 520'.

Figure 11A:
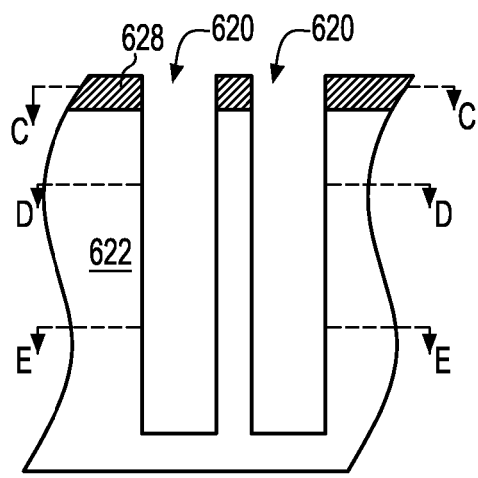
FIGS. 11A through 11E are a sectional view and plan views illustrating formation of trenches aligned with a <110> crystal plane of a semiconductor substrate in accordance with one embodiment of the invention.
Figure 11B:
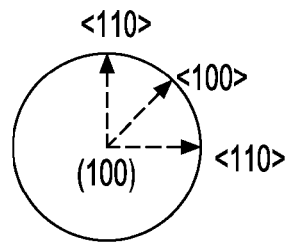
Figure 11C:
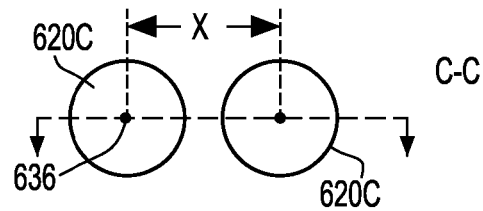

FIGS. 11A-11E illustrate closely-spaced trenches in a semiconductor substrate prior to subsequent shaping of the trenches after the reactive ion etch (RIE) process, as shown and described above with reference to FIGS. 10A-10E. FIG. 11B illustrates the orientations of the <100> and <110> crystal planes relative to each other, as in FIG. 9B. FIG. 11A shows trenches 620 in close proximity to each other, aligned with the <110> crystal plane of the substrate 622. As shown in FIG. 11C, at the section line C-C through the hard mask layer 628, the trenches have circular shape, each trench having equal length and width. Each trench opening 620C further has a center 636 which is spaced a distance X from a center of a nearest adjacent trench opening.

Figure 11D:
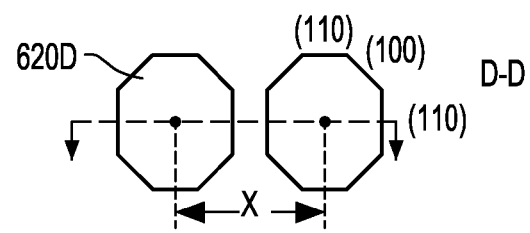
Figure 11E:
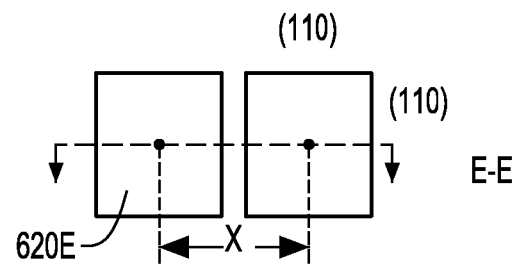

FIG. 11D illustrates the shape of the trench openings 20D through the section line D-D. Here, the trench openings 620D have octagonal shape and the centers of the trench openings 620D are spaced a distance X apart. FIG. 11E illustrates the shape of trench openings 20E near the bottoms of the trenches 620. Again, the centers of the trench openings 620E are spaced a distance X apart. Despite the close proximity of the trenches 620 to each other at the spacing X, when the trenches are aligned with the <110> crystal plane, there is no merging of the trenches at any depth within the substrate 622. The trenches 620 remain individual and separated physically from each other.

Figure 12A:
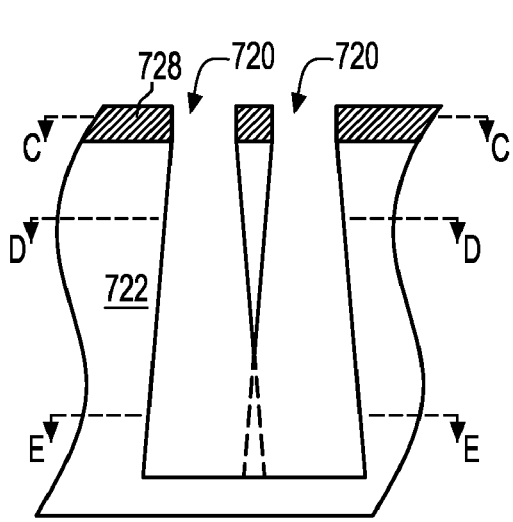
FIGS. 12A through 12E are a sectional view and plan views illustrating formation of trenches aligned with a <100> crystal plane of a semiconductor substrate in accordance with one embodiment of the invention.
Figure 12C:
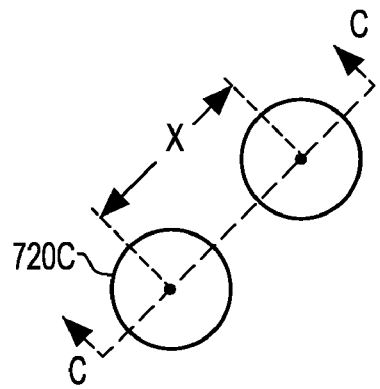
Figure 12D:
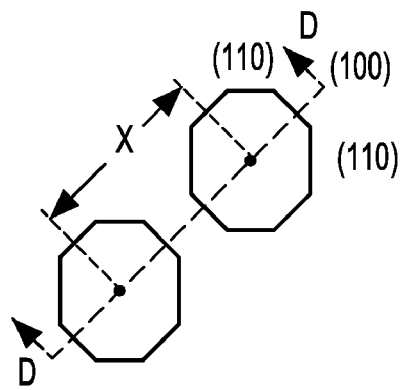
Figure 12B:
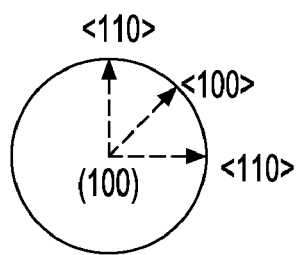
Figure 12E:
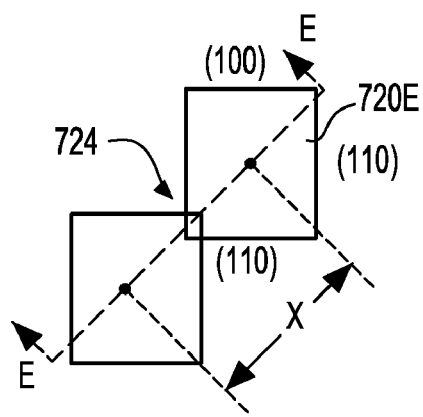
Figure 13A:
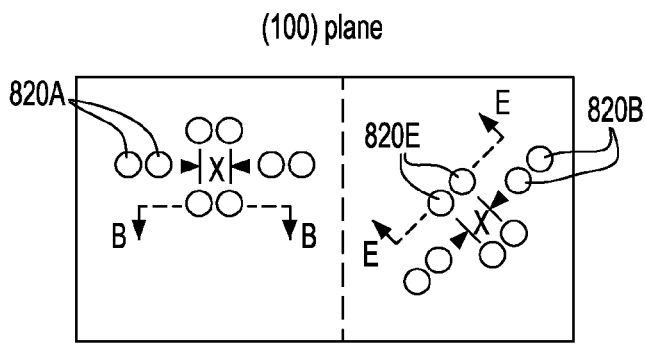
FIGS. 13A through 13E illustrate a method of simultaneously forming merged and separate trenches aligned with <100> and <110> crystal planes of a semiconductor substrate in accordance with one embodiment of the invention.
Figure 13B:
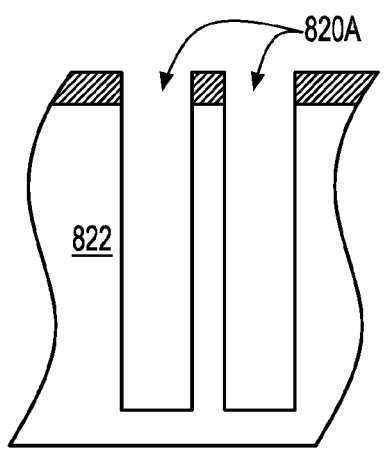
Figure 13D:
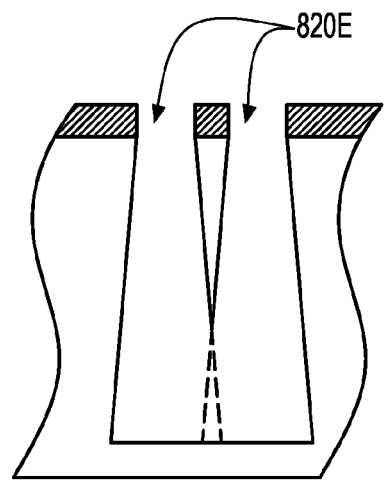
Figure 13C:
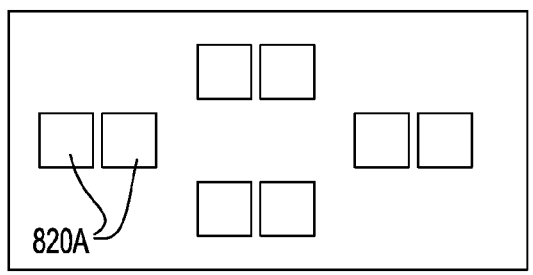
Figure 13E:
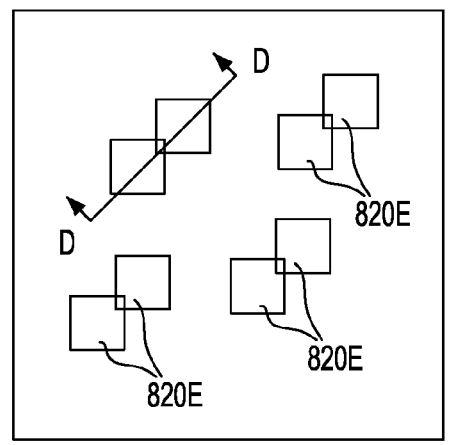

FIGS. 12A-12E also illustrate closely-spaced trenches in a semiconductor substrate prior to performing post-RIE shaping as shown and described above with reference to FIGS. 10A-10E. FIG. 12B illustrates the orientations of the <100> and <110> crystal planes relative to each other. FIG. 12A shows trenches 720 in close proximity to each other, aligned with the <100> crystal plane of the substrate 722. FIG. 12C illustrates the trench openings 720C in the hard mask layer 728 (FIG. 12A). Again, the centers of the circular trench openings 720C are spaced a distance X from each other. This is also true for the spacing X between centers at the greater depths through section line D-D in FIG. 12D and through section line E-E in FIG. 12E. As best seen in FIG. 12E, trench openings 720E merge at least at greater depths of the substrate 22. Merging occurs at corners 724 where the walls of the trenches aligned with the <100> crystal plane extend outward to cause the corners of the trenches to overlap, as shown at section line E-E in FIG. 12A and in the plan view of FIG. 12E.

FIGS. 13A through 13E illustrate results of simultaneous patterning of trenches with different alignments in a single-crystal semiconductor substrate 822 having a major surface which coincides with the (100) crystal plane. Here, the centers of trenches 820A are aligned with the <110> crystal plane and the centers of trenches 820E are aligned with the <100> crystal plane. As shown and previously discussed in FIGS. 11A-11E and 12A-12E, the size and shape of openings in a hard mask layer which define the trenches are the same. When the centers of the trenches are at a close spacing X, the trenches 820A (FIGS. 13B-C) aligned with the <110> crystal plane remain separated. However, the trenches 820E (FIGS. 13D-E) having the same close spacing X and aligned with the <100> crystal plane have bottoms which are merged together. Thus, as seen in FIGS. 13A-13E, using photomask patterns having the same size and the same center-to-center spacing, both individually separated trenches 820A and merged trenches 820E can be formed in one single-crystal semiconductor substrate wherein the major surface is aligned with the (100) crystal plane. The separated trenches and merged trenches can be formed simultaneously using the same etch process, by forming the separated trenches 820A in alignment with the <110> crystal plane and forming the merged trenches in alignment with the <100> crystal plane. Thereafter, the individually separated trenches 820A shown in FIG. 13B can be further processed to form individually separate trench capacitors and the merged trenches 820E can be further processed to form merged trench capacitors, as shown and described above with respect to FIGS. 7A through 8B. Optionally, the shaping process as described above can be performed after forming trenches 820A and 820E.

As shown in FIGS. 9C, 10C, 11C, 12C and 13A, the trench openings have circular shape in the hard mask layer. Lower down, the shape of the trench openings is similar to a regular (even-sided) polygon such as an octagon shape opening 20D (FIG. 9D) or square shape opening (FIG. 9E). In a variation of the above-described embodiment, trenches shown in FIGS. 9C, 10C, 11C, 12C and 13A can instead have oval shape, in which the trench is longer in one direction than in another direction. In such case, the trenches illustrated in other figures (e.g., as in FIG. 9E) will be longer in one direction than in another, such that, for example, the trenches may be rectangular in shape. The same spacings can still be maintained between centers of the trenches so that the same relationships of individual and merged trenches result as described above.

While the invention has been described in accordance with certain preferred embodiments thereof, many modifications and enhancements can be made thereto without departing from the true scope and spirit of the invention, which is limited only by the claims appended below.

What is claimed is:

1. A method of simultaneously fabricating merged trenches and spaced apart trenches extending downwardly into a single-crystal semiconductor substrate from a major surface of the substrate, said major surface defining a plane aligned with a given crystal orientation of said semiconductor substrate, comprising:

patterning first spaced apart openings and second spaced apart openings in a mask layer overlying the substrate, each of said first and second openings having a given length, given width and a center spaced a distance X from a center of a next adjacent one of said first and second openings, said centers of said first openings being aligned with a first crystal orientation of said substrate and said centers of said second openings being aligned with a second crystal orientation of said substrate that is different from the first crystal orientation; and simultaneously etching said substrate in accordance with said first and second openings to define merged first trenches collectively defining a single interior volume and spaced apart second trenches each defining a respective separate interior volume.

2. A method as claimed in claim 1, wherein said plane defined by said major surface is aligned with one of a <100> crystal plane or a <110> crystal plane of said semiconductor substrate.

3. A method as claimed in claim 1, wherein said centers of said first trenches are aligned with at least one of <100> crystal orientation and said centers of said second trenches are aligned with at least one of <111> crystal orientation or <110> crystal orientation.

4. A method as claimed in claim 1, wherein said plane defined by said major surface is aligned with a <110> crystal plane of said substrate.

5. A method as claimed in claim 2, wherein at least part of each of said first and second trenches has hexagonal shape and said first trenches are overlapped at acute-angled corners of said first trenches.

6. A method as claimed in claim 1, wherein said plane defined by said major surface is aligned with a <100> crystal plane of said substrate.

7. A method as claimed in claim 4, wherein at least a part of each of said first trenches and said second trenches has rectangular shape and said first trenches are merged at corners of individual ones of said first trenches.

8. A method of fabricating trench capacitors including a method as claimed in claim 1, further comprising forming a first trench capacitor and a plurality of second trench capacitors, said first trench capacitor extending along walls of said first trenches and said second trench capacitors extending along walls of respective ones of said second trenches.

9. A method of fabricating trench capacitors as claimed in claim 8, wherein said step of patterning includes etching walls of said first and second trenches in a manner dependent on crystal orientations of said substrate such that said walls become more aligned with said crystal orientations of said substrate.

10. A method of fabricating trench capacitors as claimed in claim 9, wherein walls of said first and second trenches which are aligned with a <100> crystal plane of said semiconductor substrate are etched at a faster rate than walls of said first and second trenches which are aligned with at least one other crystal plane of said semiconductor substrate.

11. A method of fabricating trench capacitors as claimed in claim 10, wherein said walls of said first and second trenches are etched using an anisotropic etchant.

* * * * *